US008797101B2

(12) United States Patent
Imagawa et al.

(10) Patent No.: US 8,797,101 B2
(45) Date of Patent: Aug. 5, 2014

(54) HIGH FREQUENCY AMPLIFIER CIRCUIT

(75) Inventors: Masaki Imagawa, Kanagawa (JP);
Tsuneo Tokumitsu, Kanagawa (JP)

(73) Assignees: Sumitomo Electric Industries, Ltd., Osaka (JP); Sumitomo Electric Device Innovations, Inc., Yokohama-shi (JP)

( * ) Notice: Subject to any disclaimer, the term of this patent is extended or adjusted under 35 U.S.C. 154(b) by 33 days.

(21) Appl. No.: 13/554,189

(22) Filed: Jul. 20, 2012

(65) Prior Publication Data

US 2013/0021102 A1 Jan. 24, 2013

(30) Foreign Application Priority Data

Jul. 21, 2011 (JP) ................................. 2011-159533

(51) Int. Cl.
*H03F 3/191* (2006.01)
(52) U.S. Cl.
USPC .......................................... 330/302; 330/310
(58) Field of Classification Search
USPC .................... 330/302, 310, 311, 286
See application file for complete search history.

(56) References Cited

U.S. PATENT DOCUMENTS 5,389,891 A * 2/1995 Philippe ........................ 330/253
5,734,298 A * 3/1998 Nagaya et al. ................ 330/253
6,320,468 B2 * 11/2001 Carroll et al. ................. 330/286
7,123,099 B2 * 10/2006 Vice .............................. 330/311
7,561,001 B2 * 7/2009 Tokumitsu et al. ........... 331/167
8,264,279 B2 * 9/2012 Anegawa et al. ............. 330/286
8,508,302 B2 * 8/2013 Fujita et al. .................... 330/310
2008/0048764 A1 2/2008 Tokumitsu et al.

FOREIGN PATENT DOCUMENTS

JP 2008-035083 A 2/2008

* cited by examiner

*Primary Examiner* — Khanh V Nguyen
(74) *Attorney, Agent, or Firm* — Westerman, Hattori, Daniels & Adrian, LLP (57) ABSTRACT

A high frequency amplifier circuit includes a first transistor that has a first terminal, a second terminal and a control terminal, the first terminal being grounded, a second transistor that has a first terminal, a second terminal and a control terminal, the control terminal of the second transistor being coupled to the second terminal of the first transistor, the first terminal of the second transistor being coupled to only the second terminal of the first transistor with respect to high frequency wave, the second terminal of the second transistor being coupled to a direct-current power supply, and a first resistor of which first terminal is coupled to a node between the second terminal of the first transistor and the control terminal of the second transistor, and of which second terminal is coupled to the first terminal of the second transistor.

13 Claims, 12 Drawing Sheets

HIGH FREQUENCY AMPLIFIER CIRCUIT

CROSS-REFERENCE TO RELATED APPLICATION

This application is based upon and claims the benefit of priority of the prior Japanese Patent Application No. 2011-159533, filed on Jul. 21, 2011, the entire contents of which are incorporated herein by reference.

BACKGROUND (i) Technical Field

The present invention relates to a high frequency amplifier circuit.

(ii) Related Art

A current re-use electronic circuit that provides a direct current provided to a latter circuit to a former circuit via the latter circuit is known as a multi-stage electronic circuit. Japanese Patent Application Publication No. 2008-35083 discloses that a current re-use amplifier is used as a doubler circuit.

SUMMARY

It is an object to provide a high frequency amplifier circuit that is capable of operating at high output power.

According to an aspect of the present invention, there is provided a high frequency amplifier circuit including: a first transistor that has a first terminal, a second terminal and a control terminal, the first terminal being grounded; a second transistor that has a first terminal, a second terminal and a control terminal, the control terminal of the second transistor being coupled to the second terminal of the first transistor, the first terminal of the second transistor being coupled to only the second terminal of the first transistor with respect to high frequency wave, the second terminal of the second transistor being coupled to a direct-current power supply; and a first resistor of which first terminal is coupled to a node between the second terminal of the first transistor and the control terminal of the second transistor, and of which second terminal is coupled to the first terminal of the second transistor.

DETAILED DESCRIPTION

In a current re-use amplifier circuit, a power supply voltage is coupled to a plurality of transistors in series. Therefore, a voltage applied to each transistor gets smaller according to the number of transistors. Therefore, it is necessary to enlarge the power supply voltage to enlarge an output of the amplifier circuit.

Figure 1:
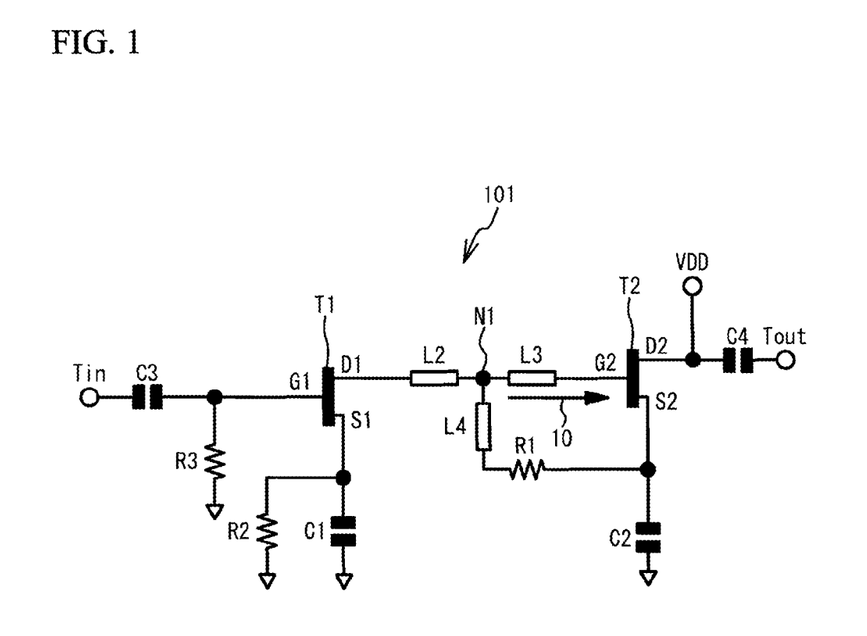
FIG. 1 illustrates a circuit diagram of an electronic circuit in accordance with a first comparative example.

FIG. 1 illustrates a circuit diagram of an electronic circuit 101 in accordance with a comparative example. As illustrated in FIG. 1, the electronic circuit 101 is a two-stage amplifier circuit having a first transistor T1 and a second transistor T2. A description will be given of an example in which a FET (Field Effect Transistor) is used as the first transistor T1 and the second transistor T2.

A capacitor C3 is coupled between an inputting terminal Tin of the electronic circuit 101 and a gate G1 (a control terminal) of the first transistor T1 in series. A node between the capacitor C3 and the gate G1 of the first transistor T1 is grounded via a resistor R3. A source S1 (a first terminal) of the first transistor T1 is grounded via the capacitor C1 and the resistor R2. The capacitor C1 and the resistor R2 are coupled to each other in parallel. A drain D1 (a second terminal) of the first transistor T1 is coupled to a gate G2 (a control terminal) of the second transistor T2 via distributed constant lines L2 and L3 in series.

A source S2 (a first terminal) of the second transistor T2 is grounded via the capacitor C2. A node N1 between the distributed constant lines L2 and L3 is coupled to a node between the source S2 of the second transistor T2 and the capacitor C2 via the distributed constant line L4 and the resistor R1 in series. A capacitor C4 is coupled between a drain D2 (a second terminal) of the second transistor T2 and an outputting terminal Tout in series. A node between the drain D2 of the second transistor T2 and the capacitor C4 is coupled to a direct-current power supply VDD to be isolated from a high frequency signal.

Figure 2:
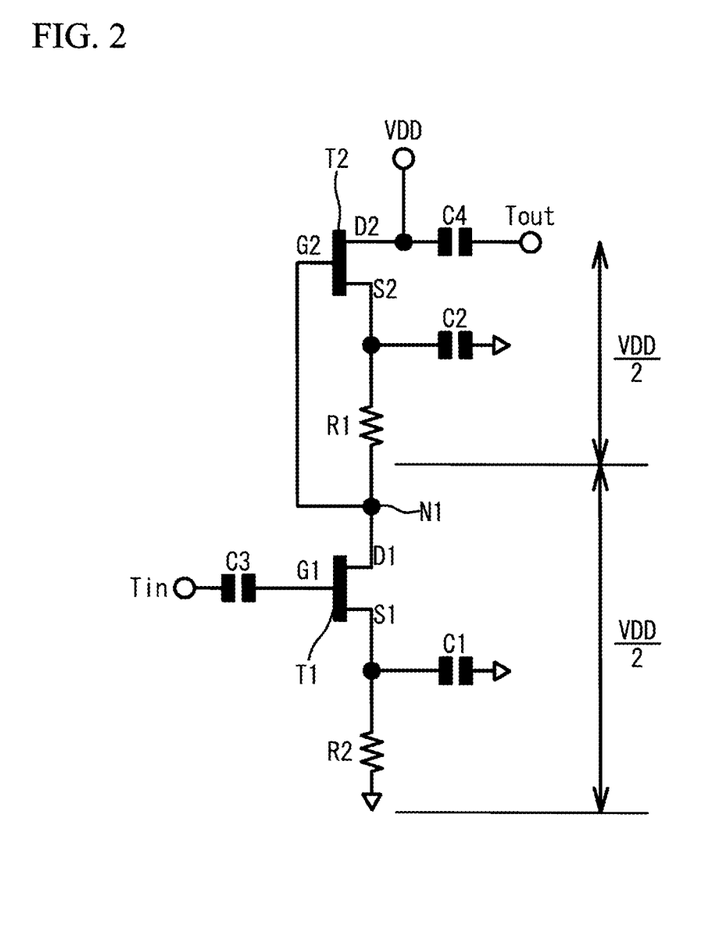
FIG. 2 illustrates a circuit diagram of the electronic circuit with respect to direct current.

FIG. 2 illustrates a circuit diagram of the electronic circuit 101 with respect to direct current. As illustrated in FIG. 2, the capacitors C1 through C4 can be ignorable with respect to direct current. The distributed constant lines L2 through L4 are short-circuited with respect to direct current. Therefore, a direct current from the power supply flows to the ground via the second transistor T2, the resistor R1, the first transistor T1 and the resistor R2. A voltage applied to the first transistor T1 may be equal to a voltage applied to the second transistor T2, when sizes (gate widths or the like) of the first transistor T1 and the second transistor T2 are approximately equal to each other and resistance values of the resistor R1 and the resistor R2 are approximately equal to each other. For example, when a voltage of "VDD" is applied to the drain D2 of the second transistor T2, a voltage of "VDD/2" is applied between the ground and the drain D1 of the first transistor T1 and a voltage of "VDD/2" is applied between the drain D1 of the first transistor T1 and the drain D2 of the second transistor T2. When the direct voltage "VDD" is 5V, the voltage "VDD/2" is approximately 2.5 V. In the following description, the direct voltage "VDD" is 5V, each voltage drop of the first transistor T1 and the second transistor T2 is approximately 2.3 V, and each voltage drop of the resistor R1 and the resistor R2 is approximately 0.2 V. The values are an example. Therefore, the values are not limited to the above-mentioned values.

Figure 3A:
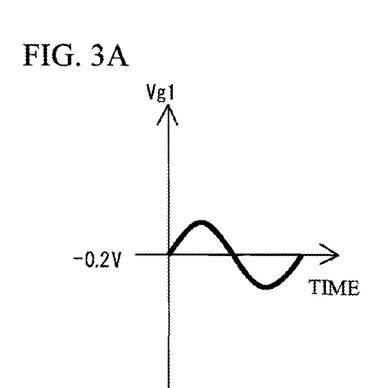
FIG. 3A through FIG. 3F illustrate fluctuations of a voltage signal at each terminal of each transistor in accordance with the first comparative example.
Figure 3B:
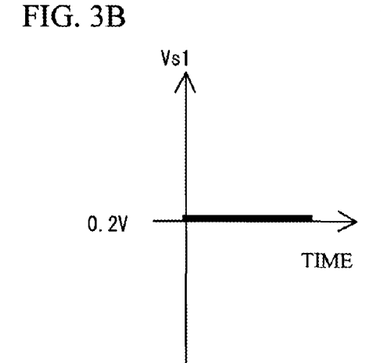

FIG. 3A through FIG. 3F illustrate fluctuations of voltages at terminals of transistors in accordance with the comparative example. A horizontal axis indicates time, and a vertical axis indicates voltage. As illustrated in FIG. 3A, a voltage Vg1 of a high frequency signal of which reference is –0.2 V is input to the gate G1 of the first transistor T1. As illustrated in FIG. 3B, a voltage Vs1 of the source S1 of the first transistor T1 is 0.2 V corresponding to the voltage drop of the resistor R2.

Figure 3C:
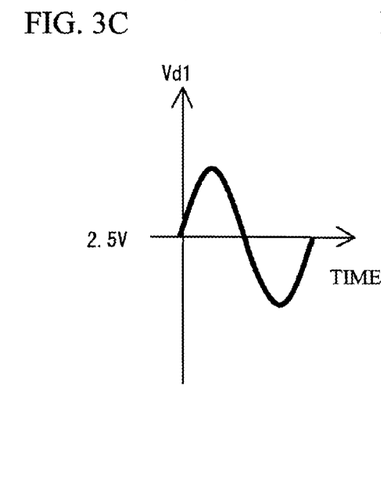
Figure 3D:
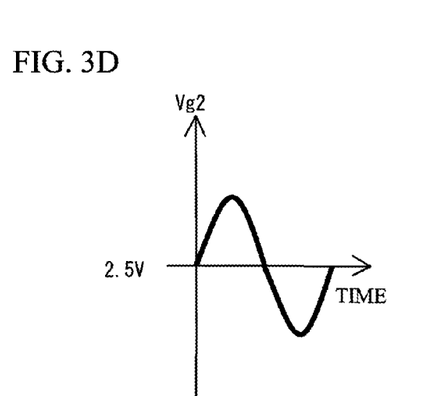

2.5 V corresponding to the voltage drop by the resistor R2 and the first transistor T1 is biased to the drain D1 of the first transistor T1. Therefore, as illustrated in FIG. 3C, a drain voltage Vd1 of the first transistor T1 has a value in which a high frequency signal amplified by the first transistor T1 is overlapped with a reference voltage of 2.5 V. As illustrated in FIG. 3D, a signal that is substantially the same as that of FIG. 3C is input to a voltage Vg2 of the gate G2 of the second transistor T2, although phase fluctuation appears.

Figure 3E:
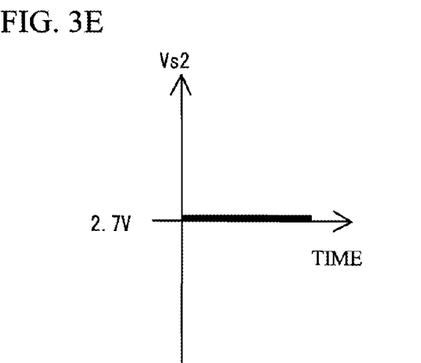
Figure 3F:
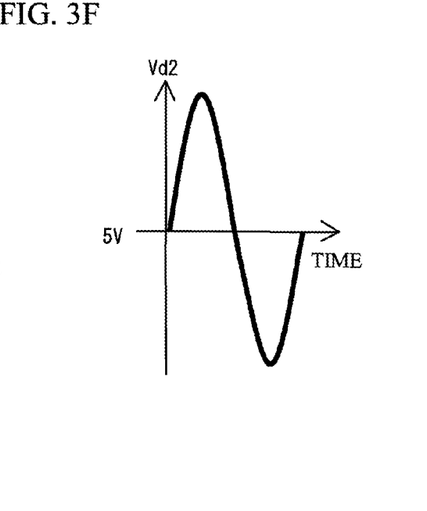

As illustrated in FIG. 3E, a voltage Vs2 of the source S2 of the second transistor T2 is 2.7 V corresponding to the voltage drop of the direct voltage by the resistor R2, the first transistor T1 and the resistor R1. A high frequency signal is not input to the source S2 of the second transistor T2, because a high frequency signal is grounded by the capacitor C2. The voltage "VDD" of 5V is applied to the voltage Vd2 of the drain D2 of the second transistor T2. Therefore, as illustrated in FIG. 3F, in the voltage Vd2, a high frequency signal amplified by the second transistor T2 is overlapped with a direct voltage of 5V.

An output electrical power of the electronic circuit 101 in accordance with the comparative example gets larger when a source-drain voltage Vds2 of the second transistor T2 gets larger. The source-drain voltage Vds2 of the second transistor T2 is "the voltage Vd2–the voltage Vs2".

It has been found that an electrical power of an output signal does not get larger than expected even if an electrical power of an input signal is enlarged in the electronic circuit 101. It is thought that the reasons are follows. When the electrical power of the input signal is enlarged in FIG. 1, a high frequency signal amplified by the first transistor T1 is input to the gate G2 of the second transistor T2 (as indicated by an arrow 10 of FIG. 1). Therefore, the second transistor T2 tries to flow a drain current more than the first transistor T1. However, in the current re-use circuit, the drain current flowing in the first transistor T1 and the second transistor T2 is kept constant. This results in increase of the voltage Vs2 of the source S2 of the second transistor T2.

Figure 4:
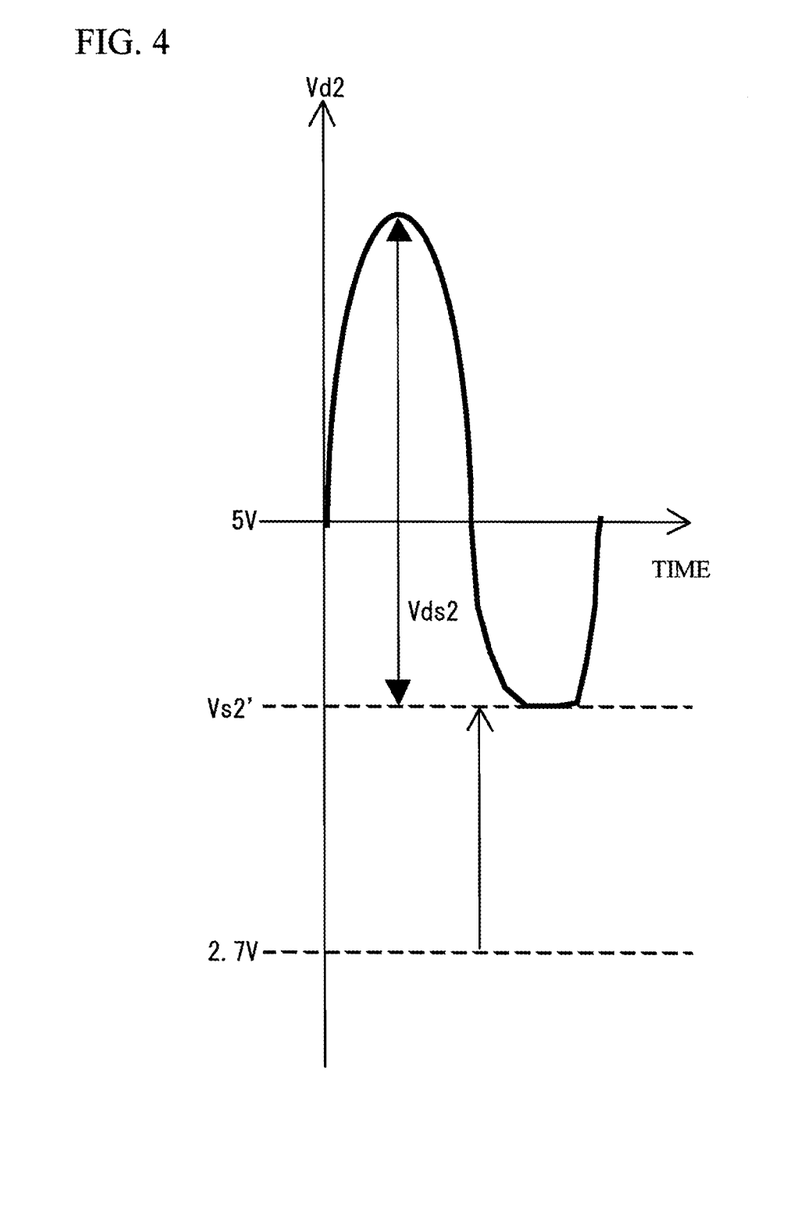
FIG. 4 illustrates a schematic view of a voltage Vd2 of a drain D2 of a second transistor T2.

FIG. 4 illustrates a schematic view of the voltage Vd2 of the drain D2 of the second transistor T2. A high frequency signal amplified by the second transistor T2 is overlapped with the direct voltage of 5V. The voltage Vs2 of the source S2 of the second transistor T2 increases from 2.7 V of FIG. 3E to a voltage Vs2'. Thus, the source voltage Vs2' suppresses the lower voltage side of the high frequency signal. The drain-source voltage Vds2 of the second transistor T2 is a voltage of "Vd2-Vs2". The drain-source voltage Vds2 is suppressed because the voltage Vs2 increases to the voltage Vs2' that is larger than 2.7 V. Thus, the amplitude of the high frequency signal is suppressed. Therefore, the electrical power of the output signal is not enlarged even if the electrical power of the input signal is enlarged.

Embodiment

Figure 5:
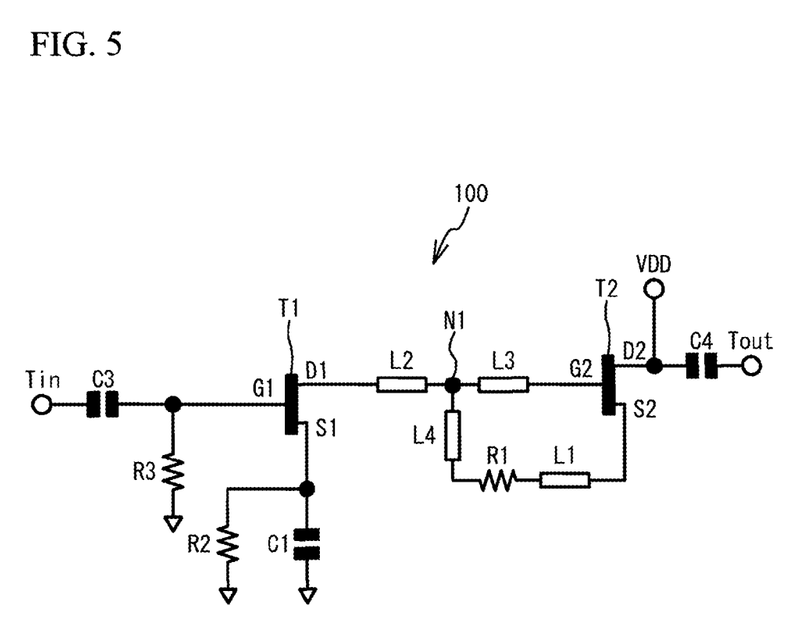
FIG. 5 illustrates an electronic circuit in accordance with a first embodiment.

A description will be given of an embodiment solving the above-mentioned problem. FIG. 5 illustrates an electronic circuit 100 in accordance with the embodiment. As illustrated in FIG. 5, the electronic circuit 100 does not have the capacitor C2. A distributed constant line L1 is provided between the resistor R1 and the source S2 of the second transistor T2. The other connection relation is the same as that of FIG. 1 of the comparative example. Therefore the explanation of the other connection relation is omitted. The source S2 of the second transistor T2 is not grounded with respect to high frequency wave, because the capacitor C2 is not provided in the embodiment. That is, the source S2 of the second transistor T2 is coupled to the drain D1 of the first transistor T1 with respect to high frequency wave. The resistor R1 determines the potential of the gate G2 and the source S2 of the second transistor T2. The resistor R2 determines the potential of the source S1 of the first transistor T1. The distributed constant lines L2 to L4 match the impedance between the first transistor T1 and the second transistor T2. The resistor R1 matches the impedance between the first transistor T1 and the second transistor T2 with respect to resistance. The resistor R1 determines the potential of the gate G2 of the second transistor T2. The distributed constant line L1 adjusts a phase difference between the drain D2 and the source S2 of the second transistor T2, as described later. The capacitors C3 and C4 are a capacitor for cutting a direct component.

Figure 6A:
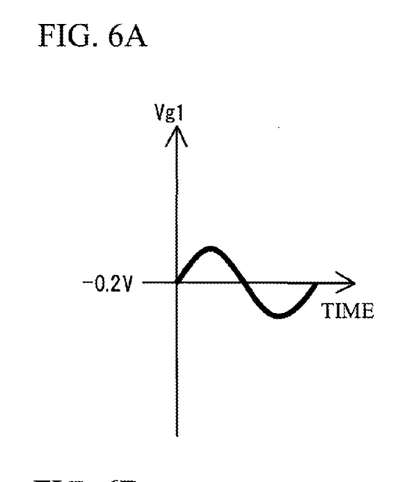
FIG. 6A through FIG. 6F illustrate fluctuation of a voltage signals at each terminal of each transistor of the first embodiment.
Figure 6B:
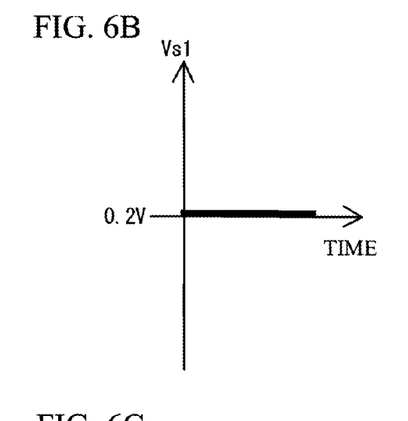
Figure 6C:
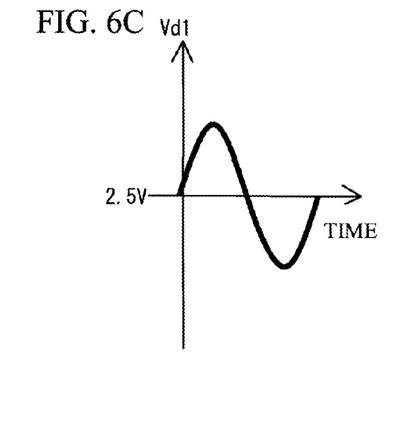
Figure 6D:
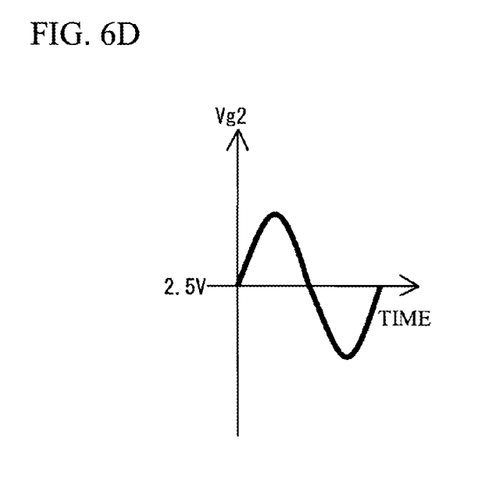
Figure 6E:
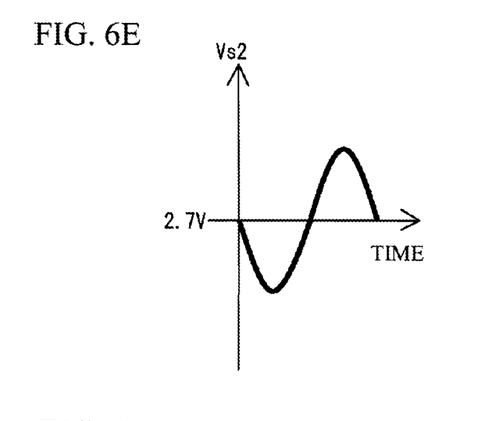
Figure 6F:
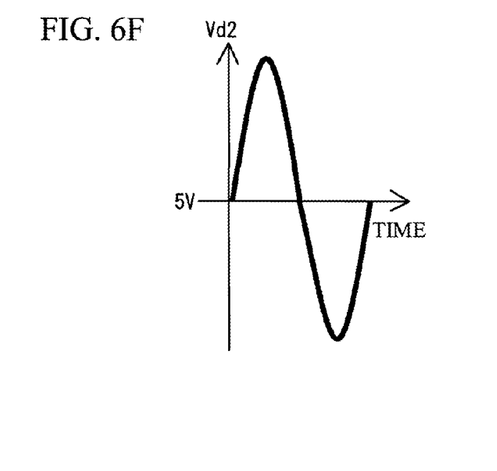

FIG. 6A through FIG. 6F illustrate fluctuations of voltage signals at terminals of transistors of the first embodiment. A horizontal axis indicates time, and a vertical axis indicates a voltage. FIG. 6A through FIG. 6D and FIG. 6F are the same as FIG. 3A through FIG. 3D and FIG. 3F. Therefore, the explanation is omitted. As illustrated in FIG. 6E, a high frequency signal is overlapped with the voltage Vs2 of the source S2 of the second transistor T2, because the source S2 is not grounded with respect to high frequency wave.

Figure 7A:
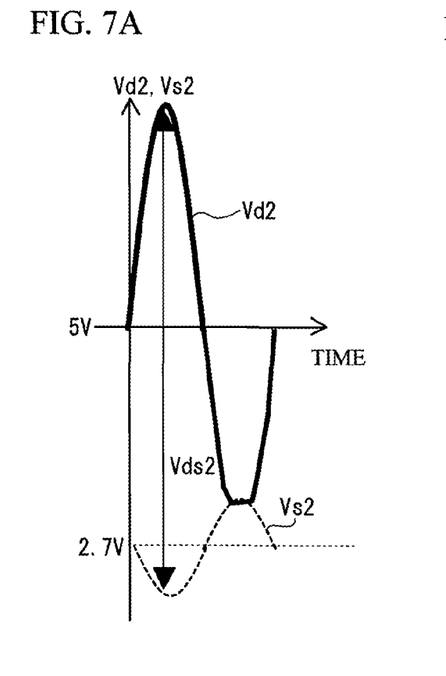
FIG. 7A and FIG. 7B illustrate a schematic view of a voltage Vd2 and a voltage Vs2.
Figure 7B:
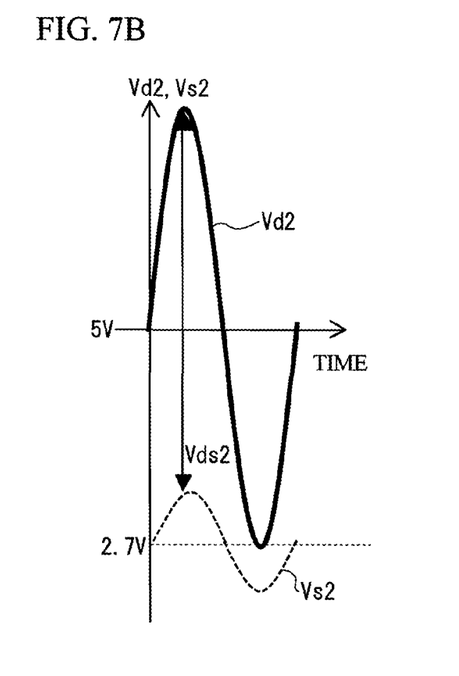
Figure 7C:
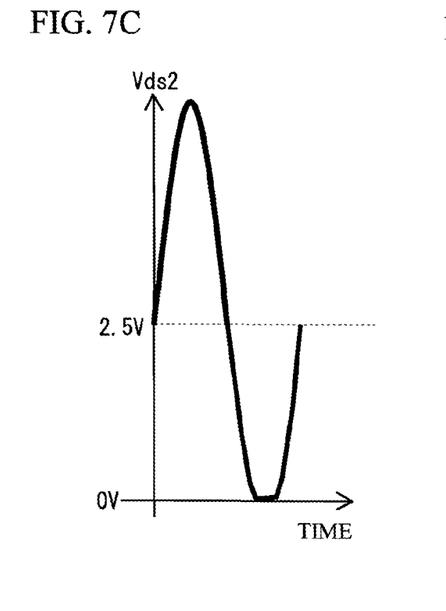
FIG. 7C and FIG. 7D illustrate a schematic view of a source-drain voltage Vds2.
Figure 7D:
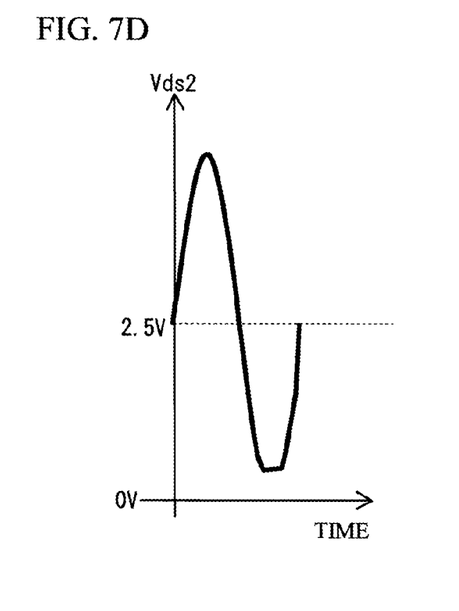

Next, a description will be given of a phase difference between the source voltage vs2 and the drain voltage vd2 of the second transistor t2. FIG. 7a and FIG. 7b illustrate a schematic view of the voltage vd2 and the voltage vs2. FIG. 7c and FIG. 7d illustrate a schematic view of the source-drain voltage vds2 of the second transistor t2. FIG. 7a and FIG. 7c are an example where a phase of the voltage vd2 is opposite to a phase of the voltage vs2. FIG. 7b and 7d are an example where a phase of the voltage vd2 is equal to a phase of the voltage vs2.

In FIG. 7A and FIG. 7B, in the drain voltage Vd2 (a solid line) of the second transistor T2, the output of the second transistor T2 is overlapped with the power supply voltage VDD of 5V. In the source voltage Vs2 (a broken line) of the second transistor T2, a high frequency signal is overlapped with a reference voltage of 2.7 V. The drain-source voltage Vds2 is a difference between the voltage Vd2 and the voltage Vs2. In FIG. 7A, a phase of the voltage Vd2 (a solid line) is opposite to a phase of the voltage Vs2. In FIG. 7B, a phase of the voltage Vd2 (a solid line) is equal to a phase of the voltage Vs2 (a broken line).

As illustrated in FIG. 7C and FIG. 7D, when the voltage Vd2 and the voltage Vs2 have an opposite phase, the drain-source voltage Vds2 gets larger than when the voltage Vd2 and the voltage Vs2 have an identical phase. That is, the drain output of the second transistor T2 is the maximum when the voltage Vd2 and the Vs2 have an opposite phase. In the electronic circuit 100 in accordance with the embodiment of FIG. 6, it is the most preferable that the voltage Vd2 and the voltage Vs2 have an opposite phase. When the voltage Vd2 and the voltage Vs2 have a different phase, the drain-source voltage Vds2 gets larger than when the voltage Vd2 and the voltage Vs2 have an identical phase. That is, the drain output of the second transistor T2 gets larger. It is preferable that the phase difference between the voltage Vd2 and the voltage Vs2 is in a range of 90 degrees or more and 270 degrees or less. It is more preferable that the phase difference is in a range of 120 degrees or more and 240 degrees or less. It is still more preferable that the phase difference is in a range of 150 degrees or more and 210 degrees or less. In these cases, the drain output of the second transistor T2 gets larger.

Figure 8:
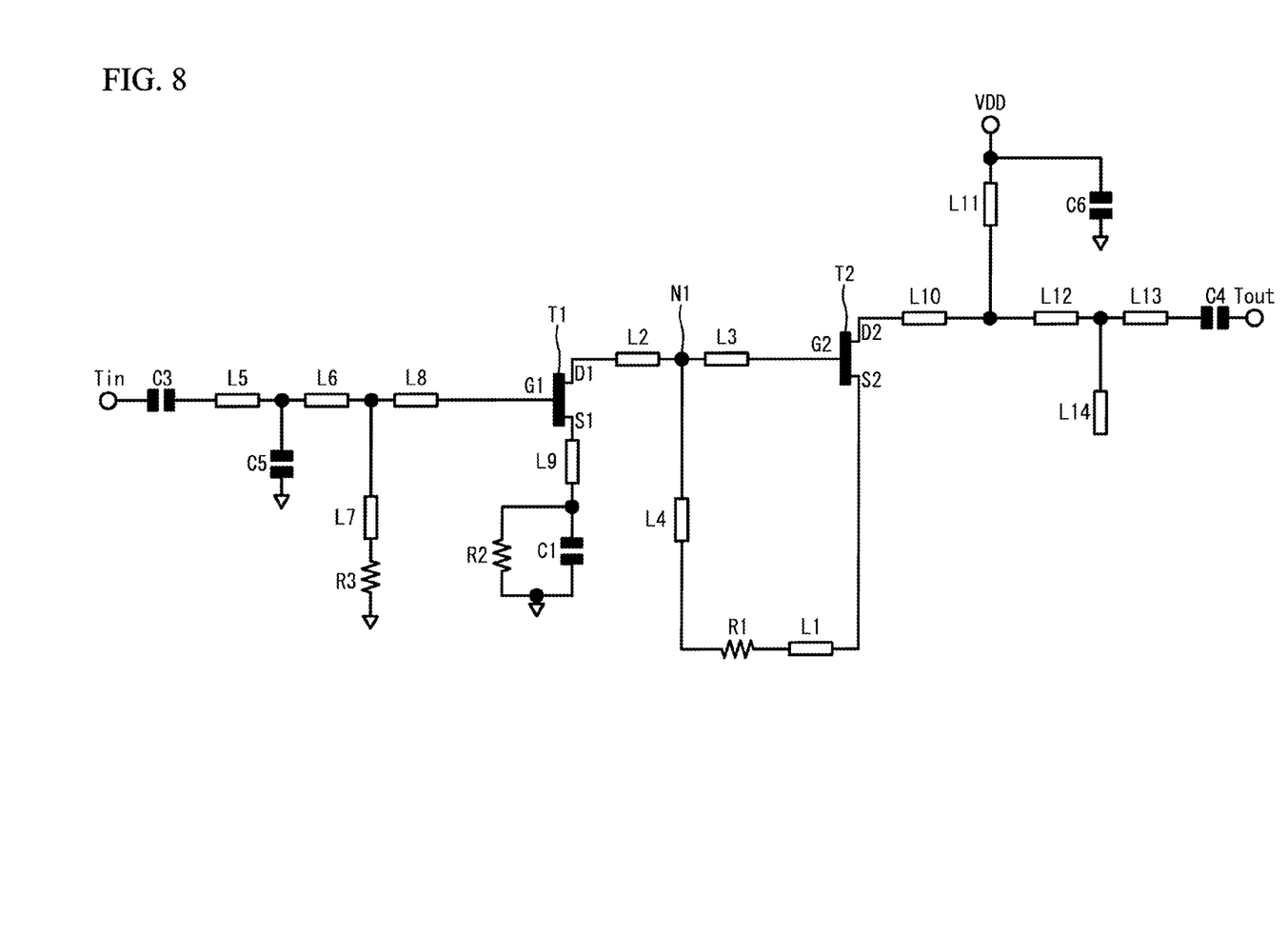
FIG. 8 illustrates a circuit subjected to a simulation.

As illustrated in FIG. 7A through FIG. 7D, the output electrical power of the electronic circuit 100 in accordance with the embodiment fluctuates according to the phase difference between the voltage Vd2 and the voltage Vs2. A description will be given of a simulation of the electronic circuit 100. FIG. 8 illustrates a circuit subjected to the simulation. As illustrated in FIG. 8, distributed constant lines L5, L6 and L8 are coupled between the capacitor C3 and the gate G1 of the first transistor T1 in series. The capacitor C5 is coupled between the ground and a node between the distributed constant lines L5 and L6. A distributed constant line L7 and the resistor R3 are coupled between the ground and a node between the distributed constant lines L6 and L8 in series. The distributed constant lines L5 to L8, the capacitor C5 and the resistor R3 act as an impedance-matching circuit between a gate bias circuit with respect to the gate G1, the inputting terminal Tin and the gate G1. A distributed constant line L9 for matching the source S1 and the ground is coupled between the source S1 of the first transistor T1, the resistor R2 and the capacitor C2.

Distributed constant lines L10, L12 and L13 are coupled between the second transistor T2 and the capacitor C4 in series. A distributed constant line L11 is coupled between a node between the distributed constant lines L10 and L12 and the direct-current power supply VDD in series. A capacitor C6 is coupled between the direct-current power supply VDD and the ground. An open stub L14 is coupled between the distributed constant lines L12 and L13. The distributed constant lines L10 to L14 act as an impedance-matching circuit between the drain bias circuit with respect to the drain D2, the drain D2 and the outputting terminal Tout.

Table 1 shows each value used for the simulation. Each distributed constant line of FIG. 8 is a micro strip line. The distributed constant line has a dielectric body composed of polyimide provided on a GaAs substrate. A ground face composed of metal is provided on the dielectric body. A line conductor composed of metal is provided in the dielectric body. Table 1 shows lengths L and widths W of the distributed constant lines. The thickness of the dielectric body is 8 μm. The capacitors and the resistors have a capacitance value and a resistance value shown in Table 1. The first transistor T1 and the second transistor T2 are a HEMT (High Electron Mobility Transistor). Table 1 shows gate widths of the HEMT. Table 1 shows voltage values of a power supply voltage. The frequency of the high frequency signal used for the simulation is 18 GHz.

TABLE 1

| | DISTRIBUTED CONSTANT LINE | | | | | | | | | | | | | |
|---|---|---|---|---|---|---|---|---|---|---|---|---|---|---|
| | L1 | L2 | L3 | L4 | L5 | L6 | L7 | L8 | L9 | L10 | L11 | L12 | L13 | L14 |
| L μm | L1 | 450 | 10 | 530 | 220 | 210 | 260 | 20 | 20 | 640 | 700 | 230 | 110 | 420 |
| W μm | 20 | 20 | 10 | 20 | 10 | 10 | 5 | 10 | 20 | 20 | 20 | 10 | 10 | 30 |

| | CAPACITOR | | | | |
|---|---|---|---|---|---|
| | C1 | C3 | C4 | C5 | C6 |
| pF | 6.0 | 0.9 | 2.1 | 0.2 | 5.1 |

| | RESISTOR | | |
|---|---|---|---|
| | R1 | R2 | R3 |
| Ω | 3 | 3 | 5.4 |

| | TRANSISTOR | |
|---|---|---|
| | T1 | T2 |
| GATE WIDTH μm | 320 | 320 |

| | POWER SUPPLY VOLTAGE |
|---|---|
| | VDD |
| V | 5 |

Figure 9A:
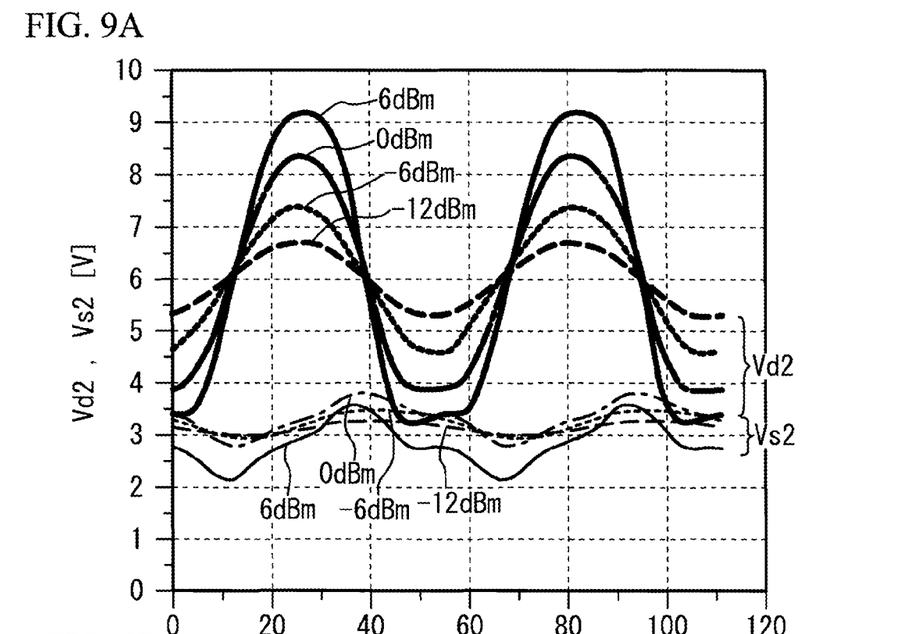
FIG. 9A and FIG. 9B illustrate a simulation result of the electronic circuit in accordance with the first embodiment.
Figure 9B:
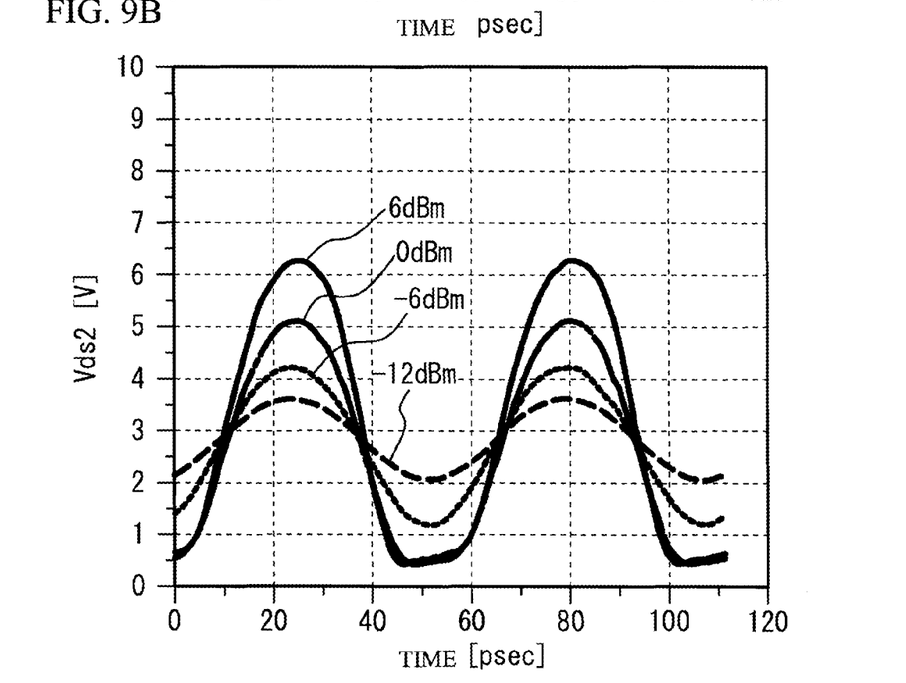

FIG. 9A and FIG. 9B illustrate a simulation result of the electronic circuit 100 in accordance with the embodiment. FIG. 9A illustrates the voltage Vs2 and the voltage Vd2 with respect to time. FIG. 9B illustrates the voltage Vds2 with respect to time. In the simulation, the length of the distributed constant line L1 is 4 mm corresponding to a half of wavelength λ of a high frequency signal to be amplified by the electronic circuit 100. The frequency of the high frequency signal is 18 GHz in the simulation. As illustrated in FIG. 9A, even if an input electrical power Pin is increased to −12 dBm, −6 dBm, 0 dBm and 6 dBm, the voltage Vs2 does not get larger. The amplitude of the voltage Vd2 increases as the input electrical power Pin increases. As illustrated in FIG. 9B, the voltage Vds2 increases as the input electrical power Pin increases.

Figure 10A:
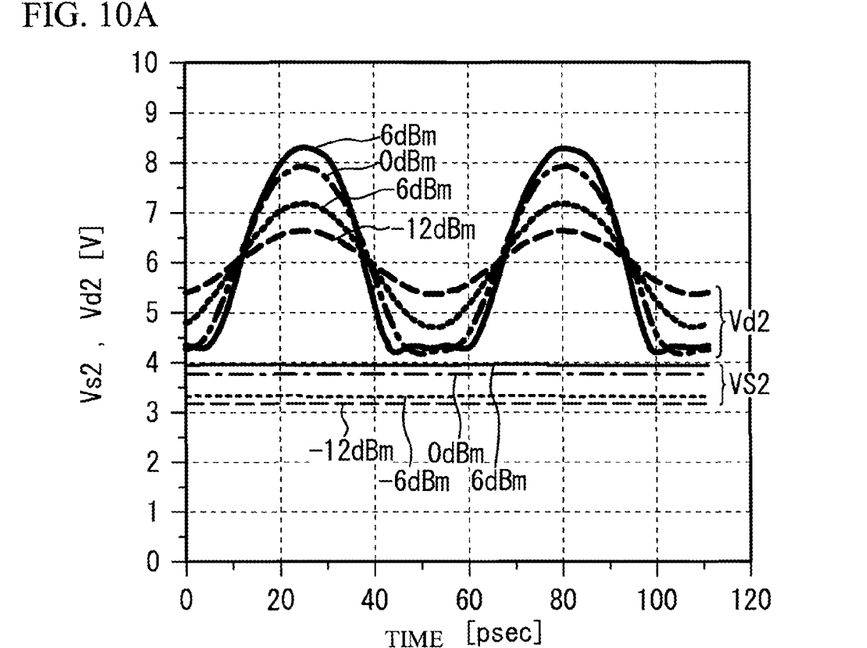
FIG. 10A and FIG. 10B illustrate a simulation result of the electronic circuit in accordance with the first comparative example.
Figure 10B:
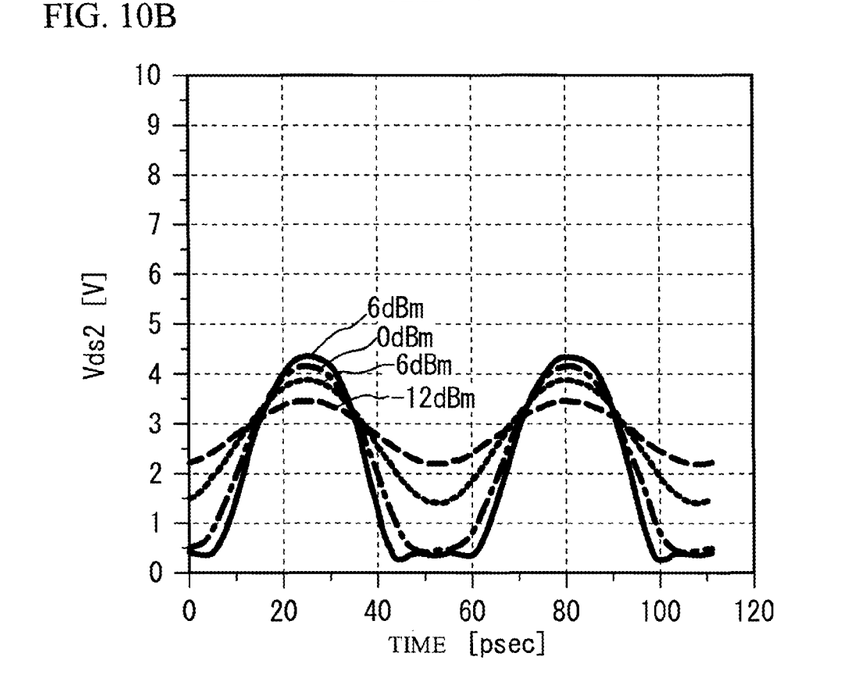

FIG. 10A and FIG. 10B illustrate a simulation result of the electronic circuit in accordance with the comparative example. FIG. 10A illustrates the voltage Vs2 and the voltage Vd2 with respect to time. FIG. 10B illustrates the voltage Vds2 with respect to time. In the simulation, the capacitor C2 of the comparative example is provided to the source S2 of the second transistor T2 in the circuit of FIG. 8 of the embodiment, and the distributed constant line L1 of FIG. 8 is removed. The capacitance of the capacitor C2 is 3 pF. The other conditions are the same as those of the simulation of the embodiment. When the input electrical power is increased to −12 dBm, −6 dBm, 0 dBM, and 6 dBm as illustrated in FIG. 10A, the voltage Vs2 gets larger. However, the increase rate of the voltage Vds2 caused by the increase of the input electrical power Pin is smaller than that of FIG. 9A. This is because the voltage Vs2 gets larger as the input electrical power increases as illustrated in FIG. 10A. In the comparative example, as illustrated in FIG. 10B, the output electrical power does not get larger with respect to the increase of the input electrical power than that of the embodiment of FIG. 9B. As mentioned above, in the embodiment of FIG. 9B, the voltage Vds2 gets larger with respect to the increase of the input electrical power than that of the comparative example of FIG. 10B. Thus, the output electrical power gets larger as the input electrical power increases, in the embodiment.

Figure 11A:
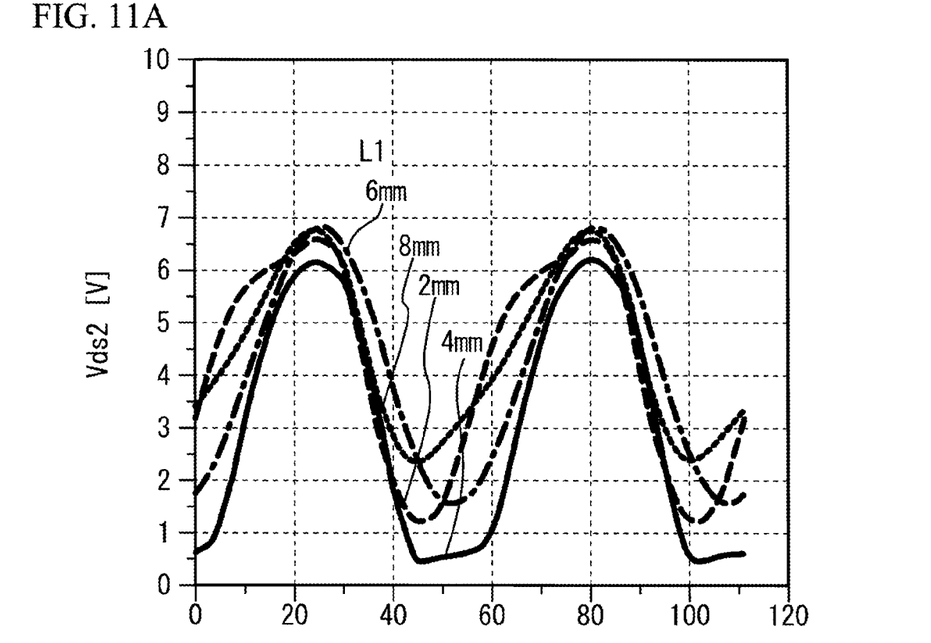
FIG. 11A illustrates a voltage Vds2 with respect to time when a length of a distributed constant line L1 is changed.
Figure 11B:
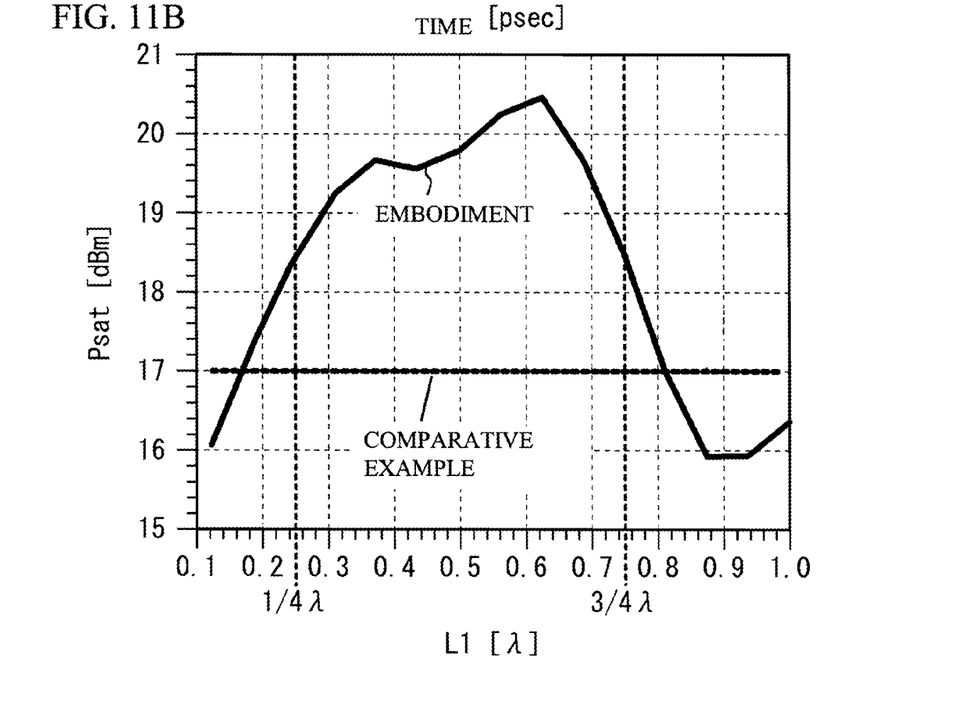
FIG. 11B illustrates the length of the distributed constant L1 normalized by a wavelength λ of a high frequency signal and a saturated electrical power Psat of the electronic circuit in accordance with the first embodiment.

FIG. 11A illustrates the voltage Vds2 with respect to time when the length of the distributed constant line L1 is changed. The input electrical power input to the electronic circuit 100 is 12 dBm at which the output electrical power is saturated. The lengths of 2 mm, 4 mm, 6 mm and 8 mm of the distributed constant line L1 correspond to $\frac{1}{4}\lambda$, $\frac{2}{4}\lambda$, $\frac{3}{4}\lambda$ and $\lambda$. The $\lambda$ is the wavelength of a high frequency signal to be amplified by the electronic circuit 100. As illustrated in FIG. 11A, the voltage Vds2 fluctuates according to the length of the distributed constant line L1. FIG. 11B illustrates the length of the distributed constant L1 normalized by the wavelength $\lambda$ of the high frequency signal and the saturated electrical power Psat of the electronic circuit in accordance with the embodiment. A solid line indicates the electronic circuit 100. A broken line indicates the electronic circuit 101. The saturated electrical power Psat is illustrated with a straight line with respect to the comparative example, because the distributed constant line L1 is not provided in the comparative example. In the embodiment, the input electrical power is 12 dBm. In the comparative example, the input electrical power is 6 dBm. Each power level is set to give a saturation in output power level. As illustrated in FIG. 11B, the saturated electrical power Psat depends on the length of the distributed constant line L1. When the length of the distributed constant line L1 is $\frac{1}{4}\lambda$ to $\frac{3}{4}\lambda$, the saturated electrical power Psat gets larger. This is because the phase of the voltage Vd2 of the drain D2 of the second transistor T2 is approximately opposite to the phase of the voltage Vs2 of the source S2, when the length of the distributed constant line L1 is $\frac{1}{4}\lambda$ to $\frac{3}{4}\lambda$.

The phase difference between the voltage Vd2 of the drain D2 and the voltage Vs2 of the source S2 of the second transistor T2 is determined by the phase difference between the gate G2 and the source S2 of the second transistor T2. Therefore, an electrical length of the distributed constant lines L3 and L4 in addition to the distributed constant line L1 has influence on the phase difference between the voltage Vd2 and the voltage Vs2. However, the distributed constant lines L3 and L4 are provided for the impedance matching, and thereby the electrical length of the distributed lines L3 and L4 is smaller than the wavelength of the high frequency signal. Therefore, the electrical length of the distributed constant line L1 mainly determines the phase difference between the voltage Vd2 of the drain D2 and the voltage Vs2 of the source S2 of the second transistor T2.

Figure 12:
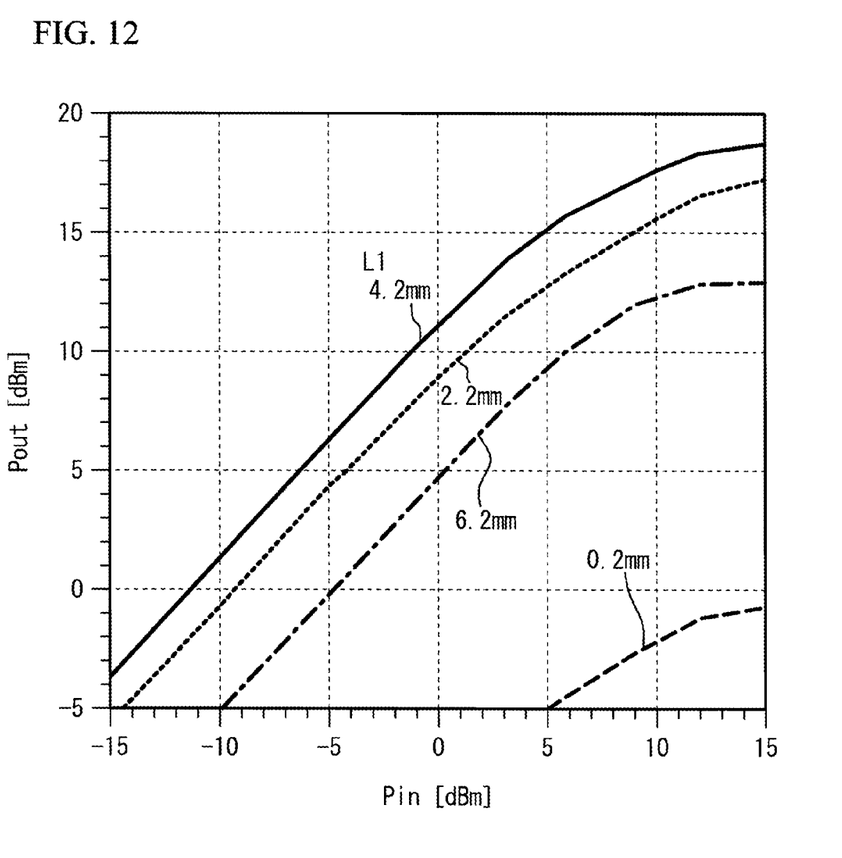
FIG. 12 illustrates an output electrical power with respect to an input electrical power in the electronic circuit in accordance with the first embodiment.

FIG. 12 illustrates an output electrical power with respect to an input electrical power in the electronic circuit in accordance with the embodiment. FIG. 12 illustrates simulation results of the output electrical power Pout with respect to the input electrical power Pin in a condition that the length of the distributed constant line L1 is changed to 0.2 mm, 2.2 mm, 4.2 mm and 6.2 mm. As illustrated in FIG. 12, when the length of the distributed constant line L1 is 4.2 mm that is close to $\frac{1}{2}\lambda$, the gain is the largest and the output electrical power Pout is enlarged.

In accordance with the embodiment, a first terminal of the distributed constant line L1 (a first distributed constant line) is coupled to the node N1 between the drain D1 of the first transistor T1 and the gate G2 of the second transistor T2, and a second terminal of the distributed constant line L1 is coupled to the source S2 of the second transistor T2. The resistor R1 (a first resistor) is coupled between the node N1 and the source S2 of the second transistor T2 in series with the distributed constant line L1. The electrical length of the distributed constant line L1 (A first distributed constant line) is longer than $\frac{1}{4}$ of the wavelength of the high frequency signal to be amplified by the first transistor T1 and the second transistor T2 and is shorter than $\frac{3}{4}$ of the wavelength. Therefore, as illustrated in FIG. 11B, the output electrical power is enlarged. It is preferable that the electrical length of the distributed constant line L1 is larger than 0.3 times as the wavelength of the high frequency signal and shorter than 0.7 times as the wavelength of the high frequency signal. It is more preferable that the electrical length of the distributed constant line L1 is larger than 0.35 times as the wavelength of the high frequency signal and shorter than 0.65 times as the wavelength of the high frequency signal. The resistor R1 has a function of determining the potential of the gate G2 of the second transistor T2. The distributed constant line L1 has another function of determining the phase difference between the gate G2 and the source S2. Therefore, the resistor R1 may be coupled between the distributed constant line L1 and the source S2.

In the embodiment, the output of the drain D1 of the first transistor T1 is overlapped with the source potential of the second transistor T2, because the drain D1 of the first transistor T1 is coupled to the source S2 of the second transistor T2 with respect to high frequency wave. That is, even if the distributed constant line L1 is not provided, the above-mentioned phase relation can be achieved when phase changing amount caused by an element between the drain D1 of the first transistor T1 and the source S2 of the second transistor T2 is adequate.

A first terminal of the resistor R2 (a second resistor) is coupled to the source S1 of the first transistor T1. A second terminal of the resistor R2 is grounded. A first terminal of the capacitor C1 is coupled to the source S1 of the first transistor T1. A second terminal of the capacitor C1 is grounded and is coupled to the resistor R2 in parallel. Thus, the source S1 of the first transistor T1 is grounded with respect to direct current and high frequency wave. And, the source S1 of the first transistor T1 is determined.

It is preferable that the resistance value of the resistor R2 is the same as that of the resistor R1, and the size (for example, a gate width) of the first transistor T1 is the same as that of the second transistor T2. In this case, the voltage applied to the first transistor T1 may be the same as that applied to the second transistor T2.

A first terminal of the distributed constant line L2 (a second distributed constant line) is coupled to the drain D1 of the first transistor T1, and a second terminal of the distributed constant line L2 is coupled to the node N1. A first terminal of the distributed constant line L3 (a third distributed constant line) is coupled to the node N1, and a second terminal of the distributed constant line L3 is coupled to the gate G2 of the second transistor T2. When the distributed constant lines L2 and L3 are provided, the impedance of the first transistor T1 is matched with that of the second transistor T2.

A first terminal of the distributed constant line L4 (a fourth distributed constant line) is coupled to the node N1, and a second terminal of the distributed constant line L4 is coupled to the source S2 of the second transistor T2 and is coupled to the distributed constant line L1 in series. It is not necessary to provide the distributed constant line L4. However, when the distributed constant line L4 is provided, the impedance of the first transistor T1 is matched with that of the second transistor T2 more accurately. The distributed constant line L4 may have the function of the distributed constant line L1.

In the embodiment, the first transistor T1 and the second transistor T2 are a FET. However, the first transistor T1 and the second transistor T2 may be a bipolar transistor. In this case, an emitter acts as the first terminal, a collector acts as the second terminal, and a base acts as the control terminal. The distributed constant lines may be an inductance element such as a short stub. The distributed constant lines may be a coplanar line or the like.

The present invention is not limited to the specifically disclosed embodiments and variations but may include other embodiments and variations without departing from the scope of the present invention.

What is claimed is:

1. A high frequency amplifier circuit comprising:
   a first transistor that has a first terminal, a second terminal and a control terminal, the first terminal being grounded;
   a second transistor that has a first terminal, a second terminal and a control terminal, the control terminal of the second transistor being coupled to the second terminal of the first transistor, the first terminal of the second transistor being coupled to only the second terminal of the first transistor with respect to high frequency wave, the second terminal of the second transistor being coupled to a direct-current power supply;
   a first resistor of which first terminal is coupled to a node between the second terminal of the first transistor and the control terminal of the second transistor, and of which second terminal is coupled to the first terminal of the second transistor; and
   a first distributed constant line of which first terminal is coupled to the first resistor, and of which second terminal is coupled to the first terminal of the second transistor.

2. The high frequency amplifier circuit as claimed in claim 1 further comprising:
   a second distributed constant line of which first terminal is coupled to the second terminal of the first transistor, and of which second terminal is coupled to the node;
   a third distributed constant line of which first terminal is coupled to the node, and of which second terminal is coupled to the control terminal of the second transistor; and
   a fourth distributed constant line of which first terminal is coupled to the node, and of which second terminal is coupled to the first terminal of the second transistor,
   the fourth distributed constant line being coupled to the first distributed constant line in series.

3. The high frequency amplifier circuit as claimed in claim 1, wherein an electrical length of the first distributed constant line is longer than ¼ of a wavelength of a high frequency signal to be amplified by the first transistor and the second transistor and is shorter than ¾ of the wavelength.

4. The high frequency amplifier circuit as claimed in claim 1, wherein a phase of a voltage of the first terminal of the second transistor is substantially opposite to a phase of a voltage of the second terminal of the second transistor.

5. The high frequency amplifier circuit as claimed in claim 1, wherein an electrical length of the first distributed constant line is longer than 0.3 times as a wavelength of a high frequency signal to be amplified by the first transistor and the second transistor and shorter than 0.7 times as the wavelength.

6. The high frequency amplifier circuit as claimed in claim 1, wherein an electrical length of the first distributed constant line is longer than 0.35 times as a wavelength of a high frequency signal to be amplified by the first transistor and the second transistor and shorter than 0.65 times as the wavelength.

7. The high frequency amplifier circuit as claimed in claim 1, wherein the first transistor and the second transistor are a HEMT (High Electron Mobility Transistor).

8. The high frequency amplifier circuit as claimed in claim 1, wherein the first distributed constant line is at least one of a micro strip line, a coplanar line, a short stub and an inductor element.

9. A high frequency amplifier circuit comprising:
   a first transistor that has a first terminal, a second terminal and a control terminal, the first terminal being grounded;
   a second transistor that has a first terminal, a second terminal and a control terminal, the control terminal of the second transistor being coupled to the second terminal of the first transistor, the first terminal of the second transistor being coupled to only the second terminal of the first transistor with respect to high frequency wave, the second terminal of the second transistor being coupled to a direct-current power supply; and
   a first resistor of which first terminal is coupled to a node between the second terminal of the first transistor and the control terminal of the second transistor, and of which second terminal is coupled to the first terminal of the second transistor,
   wherein a phase difference between a voltage of the control terminal of the second transistor and a voltage of the first terminal of the second transistor is in a range of 90 degrees or more and 270 degrees or less.

10. A high frequency amplifier circuit comprising:
    a first transistor that has a first terminal, a second terminal and a control terminal, the first terminal being grounded;
    a second transistor that has a first terminal, a second terminal and a control terminal, the control terminal of the second transistor being coupled to the second terminal of the first transistor, the first terminal of the second transistor being coupled to only the second terminal of the first transistor with respect to high frequency wave, the second terminal of the second transistor being coupled to a direct-current power supply; and
    a first resistor of which first terminal is coupled to a node between the second terminal of the first transistor and the control terminal of the second transistor, and of which second terminal is coupled to the first terminal of the second transistor,
    wherein a second resistor and a first capacitor are coupled between the first terminal of the first transistor and the ground in parallel.

11. The high frequency amplifier circuit as claimed in claim 10 further comprising a distributed constant line of which first terminal is coupled to the first terminal of the first transistor, and of which second terminal is coupled to the second resistor and the first capacitor.

12. The high frequency amplifier circuit as claimed in claim 10, wherein:
the first transistor and the second transistor have an identical gate width; and
the first resistor and the second resistor have an identical resistance value.

13. A high frequency amplifier circuit comprising:
a first transistor that has a first terminal, a second terminal and a control terminal, the first terminal being grounded;
a second transistor that has a first terminal, a second terminal and a control terminal, the control terminal of the second transistor being coupled to the second terminal of the first transistor, the first terminal of the second transistor being coupled to only the second terminal of the first transistor with respect to high frequency wave, the second terminal of the second transistor being coupled to a direct-current power supply;
a first resistor of which first terminal is coupled to a node between the second terminal of the first transistor and the control terminal of the second transistor, and of which second terminal is coupled to the first terminal of the second transistor; and
a first distributed constant line of which first terminal is coupled to the first resistor, and of which second terminal is coupled to the node.

* * * * *